(12) United States Patent
Hisano et al.

(10) Patent No.: US 12,628,275 B2
(45) Date of Patent: May 12, 2026

(54) BOARD ASSEMBLY, BOARD, AND ELECTRONIC DEVICE

(71) Applicant: Wacom Co., Ltd., Saitama (JP)

(72) Inventors: Haruhiko Hisano, Saitama (JP); Jun Kadowaki, Saitama (JP)

(73) Assignee: Wacom Co., Ltd., Saitama (JP)

( * ) Notice: Subject to any disclaimer, the term of this patent is extended or adjusted under 35 U.S.C. 154(b) by 115 days.

(21) Appl. No.: 18/457,115

(22) Filed: Aug. 28, 2023

(65) Prior Publication Data

US 2023/0403794 A1 Dec. 14, 2023

Related U.S. Application Data

(63) Continuation of application No. PCT/JP2021/011624, filed on Mar. 22, 2021.

(51) Int. Cl.
*H05K 1/11* (2006.01)
*H05K 1/02* (2006.01)
(Continued)

(52) U.S. Cl.
CPC ............. *H05K 1/118* (2013.01); *H05K 1/028* (2013.01); *H05K 1/147* (2013.01); *G06F 3/04164* (2019.05)

(58) Field of Classification Search
CPC ........ H05K 1/118; H05K 1/028; H05K 1/147; H05K 3/323; H05K 3/361; H05K 2201/05;
(Continued)

(56) References Cited

U.S. PATENT DOCUMENTS 4,561,709 A * 12/1985 Fukukura ............... H01R 12/69
439/423
6,052,172 A * 4/2000 Kajiwara ............... H05K 1/118
349/149
(Continued)

FOREIGN PATENT DOCUMENTS

JP 2003262884 A 9/2003
JP 2018092320 A 6/2018
(Continued)

OTHER PUBLICATIONS

International Search Report, mailed Apr. 27, 2021, for PCT Application No. PCT/JP2021/011624. (2 pages).

*Primary Examiner* — Steven T Sawyer
(74) *Attorney, Agent, or Firm* — Seed Intellectual Property Law Group L.L.P

(57) ABSTRACT

Provided is a board assembly including a first board including a first signal line group including signal lines extended in a first direction and lined up in a direction orthogonal to the first direction, and a second board including a second signal line group including signal lines extended in a second direction and lined up in a direction orthogonal to the second direction. The first board and the second board are fixed such that the signal lines included in the first signal line group and the second signal line group are connected in line, and the second board includes an additional signal line separated from the second signal line group in a thickness direction of the second board and extended across a second connection terminal group including a plurality of connection terminals connected to the second signal line group or the first signal line group.

11 Claims, 8 Drawing Sheets

(51) Int. Cl.
     *H05K 1/14*        (2006.01)
     *G06F 3/041*          (2006.01)

(58) Field of Classification Search
     CPC ....... H05K 2201/056; H05K 2201/052; H05K
                              2201/053; G06F 3/04164
     See application file for complete search history.

(56)                References Cited

U.S. PATENT DOCUMENTS

2006/0244463 A1 * 11/2006 Fujita ..................... G01R 31/70
                                                        324/538
2008/0186293 A1 *  8/2008 Igarashi ................ H05K 1/147
                                                        345/206

2011/0094670 A1 *  4/2011 Grunthaner ........... G06F 3/0416
                                                        156/60
2011/0169792 A1 *  7/2011 Shimizu ................ G02F 1/1309
                                                        345/204
2018/0157084 A1    6/2018 Uehara et al.
2020/0218399 A1 *  7/2020 Maeng .................. G06F 3/0443
2021/0274645 A1 *  9/2021 Hong ................... H05K 1/0219
2022/0240386 A1 *  7/2022 Li .......................... H05K 1/189
2022/0350458 A1 * 11/2022 Zhu ....................... H05K 3/363
2023/0164907 A1 *  5/2023 Li .......................... H05K 1/189
                                                        345/174

FOREIGN PATENT DOCUMENTS

JP          2018200572 A     12/2018
JP          2019145066 A      8/2019

* cited by examiner

FIG.1

F I G . 2
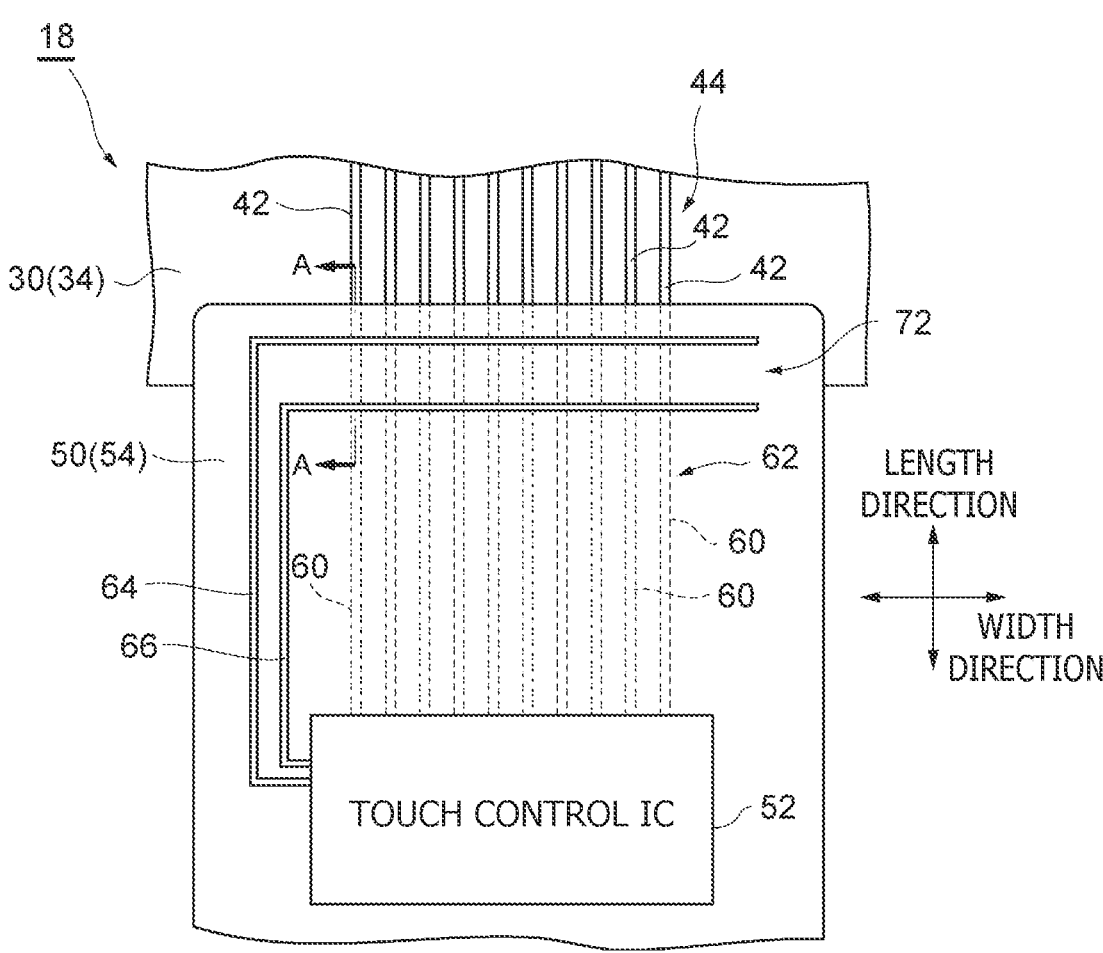
TOUCH CONTROL IC
LENGTH DIRECTION
WIDTH DIRECTION

FIG.3

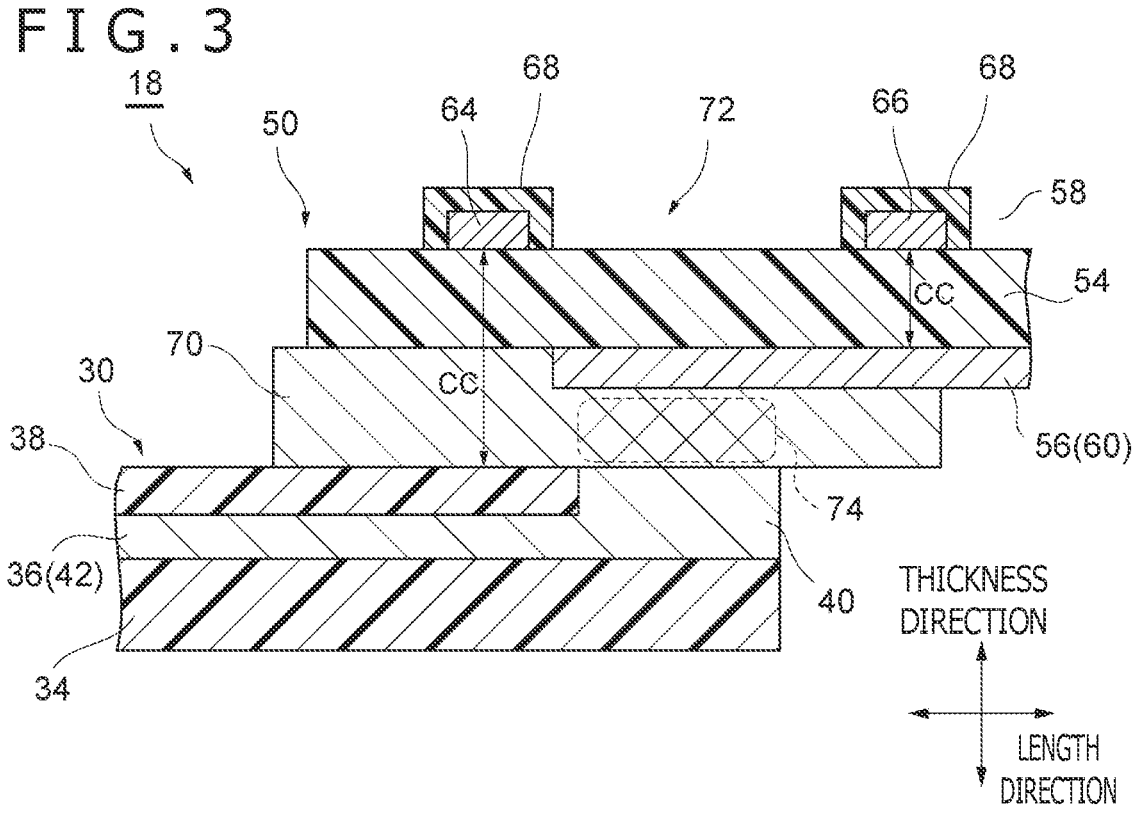

THICKNESS
DIRECTION

LENGTH
DIRECTION

FIG.4

| RESULT NO. | FIRST RECEPTION RESULT (ADDITIONAL SIGNAL LINE 64) | SECOND RECEPTION RESULT (ADDITIONAL SIGNAL LINE 66) | DETERMINATION RESULT |
|---|---|---|---|
| 1 | OK | OK | ·NO DISCONNECTION |
| 2 | OK | N/A | ·NO DISCONNECTION<br>·MALFUNCTION OF CONTROLLER |
| 3 | N/A | OK | · DISCONNECTION ON DETECTION BOARD SIDE<br>·POOR CRIMP OF BOARD<br>· MALFUNCTION OF CONTROLLER |
| 4 | N/A | N/A | · DISCONNECTION ON FLEXIBLE BOARD SIDE<br>· MALFUNCTION OF CONTROLLER |

ENLARGED VIEW OF B

BOARD ASSEMBLY, BOARD, AND ELECTRONIC DEVICE

BACKGROUND

Technical Field

The present disclosure relates to a board assembly, a board, and an electronic device.

Description of the Related Art

Conventionally, there is known a technique of inspecting whether signal lines installed on an electronic circuit board are disconnected. For example, an inspection method related to a touch sensor of capacitance type including a plurality of line electrodes arranged in a two-dimensional grid is disclosed in Japanese Patent Laid-Open No. 2019-145066.

A crimping process using, for example, an anisotropic conductive film (ACF) is used to connect boards in some cases. The crimping process has an advantage that the height and the pitch can be more easily reduced than in the connection using soldering or connector. However, the pressure fitting work increases the probability of poor connection or disconnection.

BRIEF SUMMARY

The present disclosure has been made in view of the problem, and an object of the present disclosure is to provide a board assembly, a board, and an electronic device that can inspect the connection state of boards with a simpler wiring structure.

A first aspect of the present disclosure provides a board assembly including a first board including a first signal line group including a plurality of signal lines extended in a first direction and lined up in a direction orthogonal to the first direction, and a second board including a second signal line group including a plurality of signal lines extended in a second direction and lined up in a direction orthogonal to the second direction. The first board and the second board are fixed such that the signal lines included in the first signal line group and the second signal line group are connected in line, and the second board includes an additional signal line separated from the second signal line group in a thickness direction of the second board and extended across a second connection terminal group including a plurality of connection terminals connected to the second signal line group or the first signal line group.

A second aspect of the present disclosure provides a board including a base, a signal line group on a first main surface of the base and including a plurality of lined up signal lines or a connection terminal group provided on the first main surface of the base and including a plurality of lined up connection terminals, and one or more additional signal lines provided on a second main surface of the base and extended across the signal line group or the connection terminal group.

A third aspect of the present disclosure provides an electronic device including the board assembly according to the first aspect of the present disclosure or the board according to the second aspect of the present disclosure.

According to the present disclosure, the connection state of the boards can be inspected with a simpler wiring structure.

BRIEF DESCRIPTION OF THE SEVERAL VIEWS OF THE DRAWINGS

FIG. 1 is an exploded perspective view of an electronic device provided with a sensor board group as a board assembly in a first embodiment of the present disclosure;

FIG. 2 is a partial plan view of the sensor board group illustrated in FIG. 1;

FIG. 3 is a cross-sectional view along a line A-A illustrated in FIG. 2;

FIG. 4 depicts an example of a determination method of the connection state in the sensor board group of FIGS. 2 and 3;

DETAILED DESCRIPTION

Figure 5:
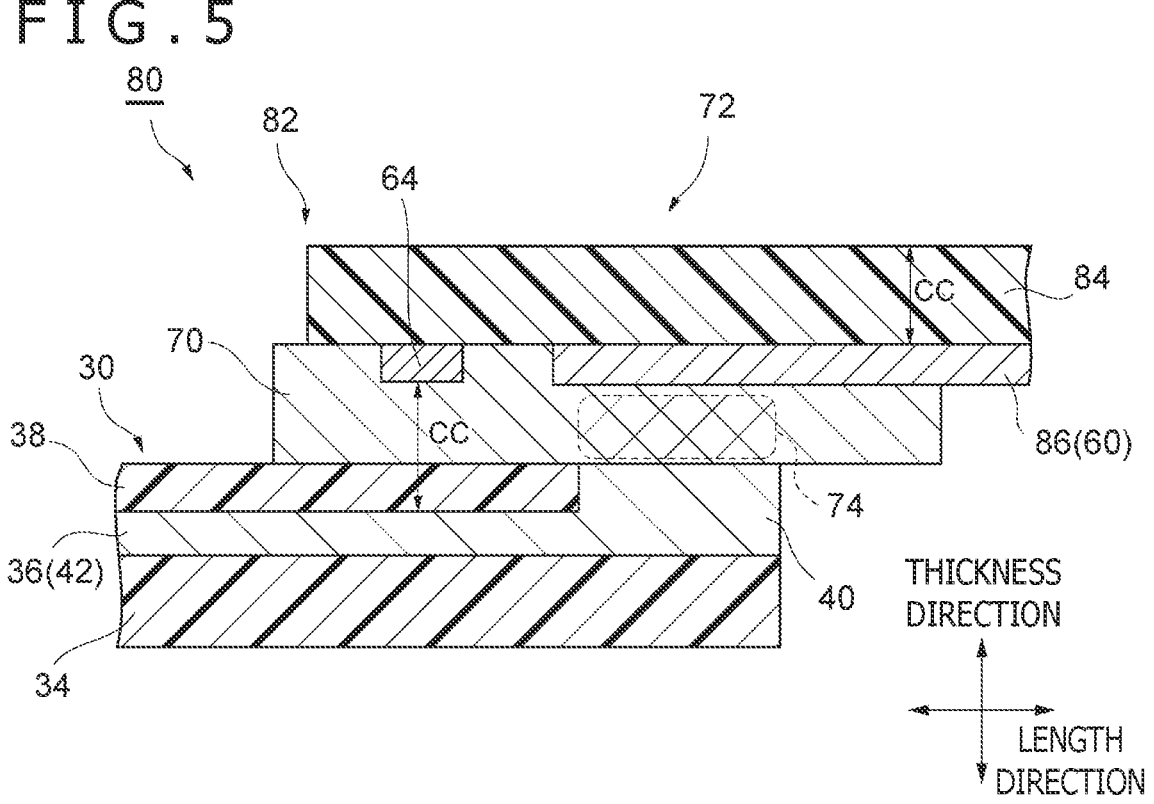
FIG. 5 is a cross-sectional view of a sensor board group in a first modification of the first embodiment.

Embodiments of the present disclosure will now be described with reference to the attached drawings. To facilitate the understanding of the description, the same reference signs are provided as much as possible to the same constituent elements in the drawings, and the description thereof will not be repeated. Note that the present disclosure is not limited to the following first to third embodiments and modifications, and it is obvious that the present disclosure can be freely changed without departing from the scope of the disclosure. In addition, configurations may be arbitrarily combined as long as there is no technical contradiction.

First Embodiment

Figure 1:
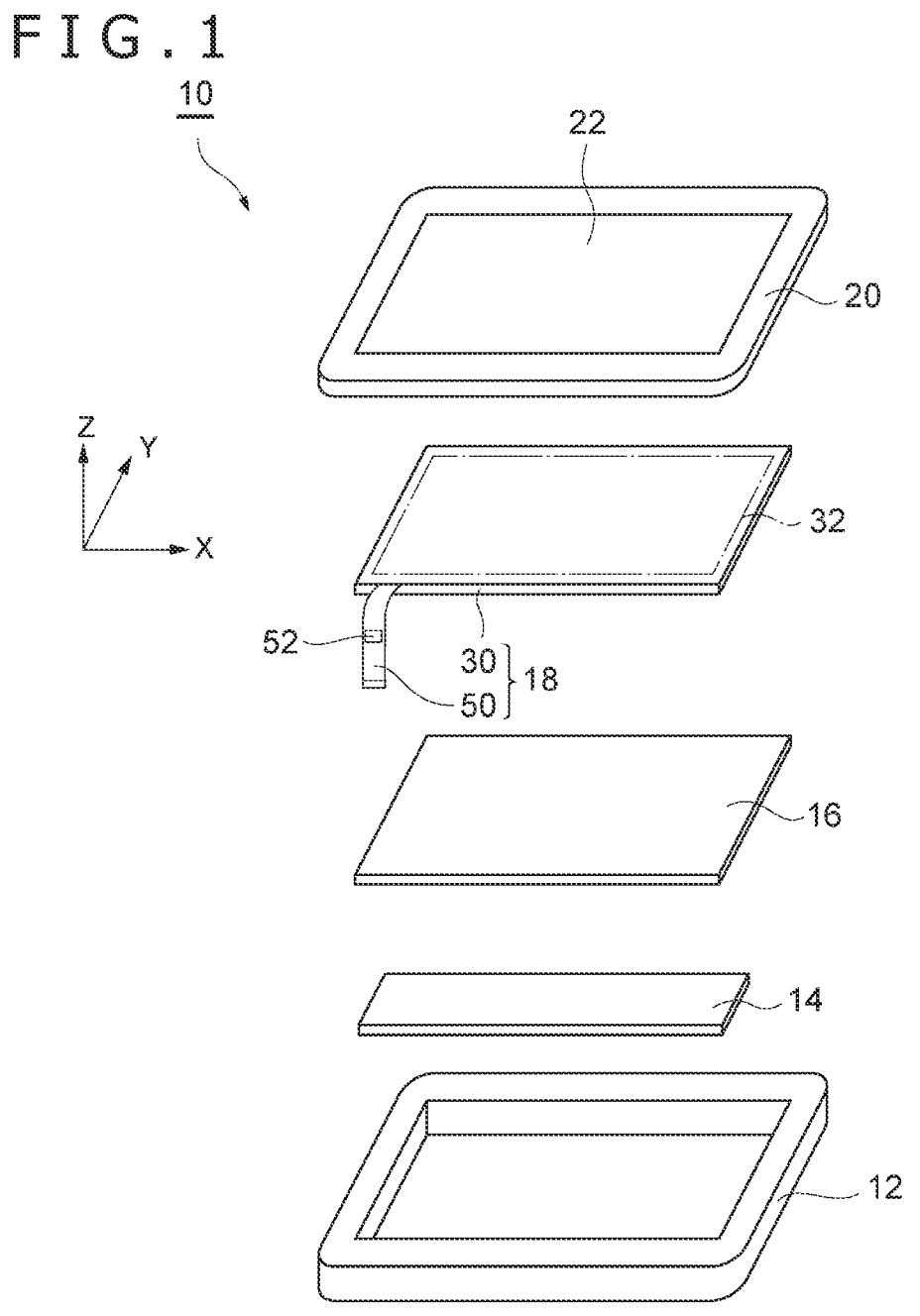

A board assembly and an electronic device in a first embodiment of the present disclosure will be described with reference to FIGS. 1 to 4.

Overall Configuration

FIG. 1 is an exploded perspective view of an electronic device 10 provided with a sensor board group 18 as a board assembly in the first embodiment of the present disclosure. The electronic device 10 may be various types of devices provided with electronic circuit boards, and for example, the electronic device 10 is a tablet computer used along with an electronic pen. The electronic device 10 includes, from the back side, layers of a back cover 12, a main board 14, a display panel 16, the sensor board group 18, and a front cover 20.

The back cover 12 and the front cover 20 are members included in a housing that houses electronic components in the electronic device 10. The front cover 20 is provided with a highly transmissive protection panel 22 covering the entire surface of an opening formed in a main surface of the front cover 20.

The main board 14 is a board included in an electric circuit that activates the electronic device 10. Various electronic components, such as a host processor, a memory, a drive integrated circuit (IC) of the display panel 16, a connector for connection to the sensor board group 18, a wireless communication module, and a power supply circuit, are arranged on the main board 14.

The display panel 16 includes, for example, a liquid crystal panel, an organic electro luminescence (EL) panel, or electronic paper. The display panel 16 applies a drive voltage to matrix signal lines arrayed in a row direction and a column direction to drive a plurality of pixels and thereby display an image or a video in a display region.

The sensor board group 18 functions as an "external" touch panel attached to the display panel 16 from the outside. The sensor board group 18 includes a detection board 30 (first board) with a detection function of an indicated position, and a flexible board 50 (second board) with flexibility. Here, the detection board 30 and the flexible board 50 are electrically connected without a connector.

The detection board 30 includes a touch sensor 32 that can detect a position indicated by a finger of the user or an electronic pen. The touch sensor 32 includes linear or block-like sensor electrodes (not illustrated) arranged in a plane shape.

An integrated circuit (hereinafter, referred to as a "touch control IC 52") that controls the drive of the touch sensor 32 is installed on the flexible board 50. The installation method may be Chip On Film (FOC) or may be Tape Automated Bonding (TAB).

Note that an arrangement relation between the display panel 16 and the sensor board group 18 is not limited to the example of FIG. 1, and the arrangement relation may be changed according to the detection system of the touch sensor 32. For example, it is more preferable to provide the sensor board group 18 above the display panel 16 in the touch sensor 32 of the active coupling system (AES). On the other hand, it is more preferable to provide the sensor board group 18 below the display panel 16 in the touch sensor 32 of the electro magnetic resonance system (EMR).

Configuration of Sensor Board Group 18

FIG. 2 is a partial plan view of the sensor board group 18 illustrated in FIG. 1. FIG. 3 is a cross-sectional view along a line A-A illustrated in FIG. 2. Hereinafter, directions will be defined based on the position and the posture of the flexible board 50. More specifically, a long side direction, a short side direction, and a height direction of the flexible board 50 will be referred to as a "length direction," a "width direction," and a "thickness direction," respectively.

As illustrated in FIG. 3, the detection board 30 and the flexible board 50 are arranged such that both ends of the detection board 30 and the flexible board 50 overlap with each other. A base 34 provided with the touch sensor 32 (FIG. 1), a conductive layer 36, and an insulating layer 38 are sequentially layered in the detection board 30. The base 34 contains an insulating heat-resistant material (for example, resin such as polyethylene terephthalate). The conductive layer 36 contains a highly conductive material (for example, metal such as copper, silver, and gold). The insulating layer 38 is provided to cover the entire surface of the conductive layer 36, except for an end in the length direction (hereinafter, a "front end exposed portion 40").

Meanwhile, the flexible board 50 includes a base 54 provided with the touch control IC 52 (FIGS. 1 and 2), a conductive layer 56 provided on a lower surface of the base 54, and a conductive layer 58 provided on an upper surface of the base. The base 54 contains an insulating heat-resistant flexible material (for example, resin such as polyimide). The conductive layers 56 and 58 contain a highly conductive material (for example, metal such as copper, silver, and gold). Note that a protection film 68 is provided to protect the conductive layer 58 (more specifically, additional signal lines 64 and 66 described later).

An anisotropic conductive film (hereinafter, referred to as an "ACF 70") is inserted between the detection board 30 and the flexible board 50. A mixed material containing fine metal particles mixed with a thermosetting resin is molded into a film shape to provide the ACF 70. The detection board 30 and the flexible board 50 are crimped at a crimp section 72 including the front end exposed portion 40. That is, the detection board 30 and the flexible board 50 are heated and pressurized at the crimp section 72 to form, in part of the ACF 70, a conductive region 74 where the conductive layers 36 and 56 are electrically connected.

As illustrated in FIG. 2, a signal line group 44 (first signal line group) including a plurality of signal lines 42 is formed by the conductive layer 36 (FIG. 3) on the detection board 30. A signal line group 62 (second signal line group) including a plurality of signal lines 60 is formed by the conductive layer 56 (FIG. 3) on the flexible board 50. The plurality of signal lines 60 is extended in the length direction and lined up in the width direction. The plurality of signal lines 42 is extended in the length direction and lined up in the width direction. The signal lines 42 and 60 included in the two signal line groups 44 and 62 are aligned such that the signal lines 42 and 60 are connected in line.

In addition, two additional signal lines 64 and 66 are formed by the conductive layer 58 (FIG. 3) on the flexible board 50. Part of the additional signal line 64 is extended in the width direction such that the additional signal line 64 crosses the signal line group 44 at a position on the front end side of the crimp section 72 in the length direction. Part of the additional signal line 66 is extended in the width direction such that the additional signal line 66 crosses the signal line group 62 at a position on the back end side of the crimp section 72 in the length direction.

The signal lines 42 are connected to the respective sensor electrodes that are part of the touch sensor 32 (FIG. 1). Also, the signal lines 60 are connected to respective detection pins included in the touch control IC 52. The additional signal lines 64 and 66 are connected to respective test pins included in the touch control IC 52.

Description of Determination Operation

The electronic device 10 and the sensor board group 18 in the first embodiment are configured in this way. Next, a determination operation of the connection state in the sensor board group 18 will be described with reference to FIGS. 2 to 4. The touch control IC 52 first starts a control mode (that is, a test mode) for periodically or irregularly inspecting the connection state of the sensor board group 18.

In a first operation of the test mode, the touch control IC 52 transmits a test signal through a first test pin. Consequently, capacitive coupling CC (FIG. 3) is formed between the additional signal line 64 and the signal lines 60, and response signals for the test signal are generated. The touch control IC 52 sequentially receives the response signals through the signal lines 60. "First reception result=OK" is determined when the strength of the response signal exceeds a threshold, and "first reception result=N/A" is determined when the strength of the response signal is equal to or lower than the threshold.

In a second operation of the test mode, the touch control IC 52 transmits a test signal through a second test pin. Consequently, capacitive coupling CC (FIG. 3) is formed between the additional signal line 66 and the signal lines 42, and response signals for the test signal are generated. The touch control IC 52 sequentially receives the response signals through the signal lines 42, the conductive region 74, and the signal lines 60. "Second reception result=OK" is determined when the strength of the response signal exceeds the threshold, and "second reception result=N/A" is determined when the strength of the response signal is equal to or lower than the threshold.

FIG. 4 depicts an example of a determination method of the connection state in the sensor board group 18 of FIGS. 2 and 3. It is determined that there is no disconnection in the signal lines 42 of the detection board 30 and the signal lines 60 of the flexible board 50 and the connection state is "normal" when both the first reception result and the second reception result are "OK" (result 1). On the other hand, it is determined that the connection state is "abnormal" in other combinations of results (results 2 to 4), and the causes are distinguished as follows.

When only the first reception result is "OK," it is determined that there is no disconnection in the signal lines 42 and 60, but there is a malfunction of the touch control IC 52 (result 2). When only the second reception result is "OK," it is determined that there is one of [1] disconnection in the signal lines 42, [2] poor crimp of the board, and [3] malfunction of the touch control IC 52 (result 3). When both the first reception result and the second reception result are "N/A," it is determined that there is one of [1] disconnection in the signal lines 60 and [2] malfunction of the touch control IC 52 (result 4).

Effects

In this way, the sensor board group 18 (board assembly) in the first embodiment includes the detection board 30 (first board) including the signal line group 44 (first signal line group) including the plurality of signal lines 42 extended in a first direction and lined up in a direction orthogonal to the first direction, and the flexible board 50 (second board) including the signal line group 62 (second signal line group) including the plurality of signal lines 60 extended in a second direction and lined up in a direction orthogonal to the second direction. The detection board 30 and the flexible board 50 are fixed such that the signal lines 42 and 60 included in the signal line groups 44 and 62 are connected in line. The additional signal lines 64 and 66 separated from the signal line group 62 in the thickness direction of the flexible board 50 and extended across the signal line group 62 are provided on the flexible board 50.

By providing the additional signal lines 64 and 66 extended across the signal line group 62, the capacitive coupling CC is formed between the signal lines 60 included in the signal line group 62 and the additional signal lines 64 and 66. The connection state of the signal lines 60 can be specified by, for example, transmitting the test signals from the additional signal lines 64 and 66 and receiving the response signals for the test signals from the signal lines 60. As a result, the connection state of the boards can be inspected with a simpler wiring structure.

Also, the ACF 70 (anisotropic conductive film) containing a thermosetting resin may be present between the detection board 30 and the flexible board 50, and the detection board 30 and the flexible board 50 may be fixed by being heated and pressed at the crimp section 72 where the ACF 70 is present.

Also, at least one additional signal line 64 may be provided on the flexible board 50, at a position on the front end side of the crimp section 72 in the length direction (second direction). Moreover, at least one additional signal line 66 may be provided on the flexible board 50, at a position on the back end side of the crimp section 72 in the length direction. Further, at least two additional signal lines 66 may be provided on the flexible board 50, across the crimp section 72 along the length direction.

Moreover, the signal line group 62 may be provided on one main surface of the flexible board 50, and the additional signal lines 64 and 66 may be provided on the other main surface of the flexible board 50. In this way, the additional signal lines 64 and 66 can also be arranged at positions overlapping with the signal line group 62 in plan view, and this increases the degree of freedom in design.

In addition, the first board may be the detection board 30 including the touch sensor 32, the second board may be the flexible board 50 with flexibility, and the touch sensor 32 may be connected to the touch control IC 52 (integrated circuit) that controls the touch sensor 32 through the signal line groups 44 and 62. Particularly, the degree of freedom in layout design of the board is further increased by providing the touch control IC 52 on the flexible board 50.

First Modification

FIG. 5 is a cross-sectional view of a sensor board group 80 in a first modification of the first embodiment. The sensor board group 80 includes the detection board 30 (first board) with a configuration similar to the configuration in the case of the first embodiment, and a flexible board 82 (second board) with a configuration different from the configuration in the first embodiment.

The flexible board 82 includes a base 84 provided with the touch control IC 52 (FIGS. 1 and 2), and a conductive layer 86 provided on a lower surface of the base 84. The base 84 contains an insulating heat-resistant flexible material (for example, resin such as polyimide). The conductive layer 86 contains a highly conductive material (for example, metal such as copper, silver, and gold).

The plurality of signal lines 42 (that is, the signal line group 44) is formed by the conductive layer 36 on the detection board 30 as in the first embodiment (FIG. 2). The plurality of signal lines 60 (that is, the signal line group 62) is formed by the conductive layer 86 on the flexible board 82. The signal lines 42 and 60 included in the signal line groups 44 and 62 are aligned such that the signal lines 42 and 60 are connected in line. Moreover, one additional signal line 64 is formed by the conductive layer 86 on the flexible board 82. Part of the additional signal line 64 is extended in the width direction such that the additional signal line 64 crosses the signal line group 44 at a position on the front end side of the crimp section 72 in the length direction.

In this way, the signal line group 62 and the additional signal line 64 may be provided on one main surface of the flexible board 50. Also according to the configuration, the connection state of the boards can be inspected with a simpler wiring structure as in the case of the first embodiment.

Second Modification

Figure 6:
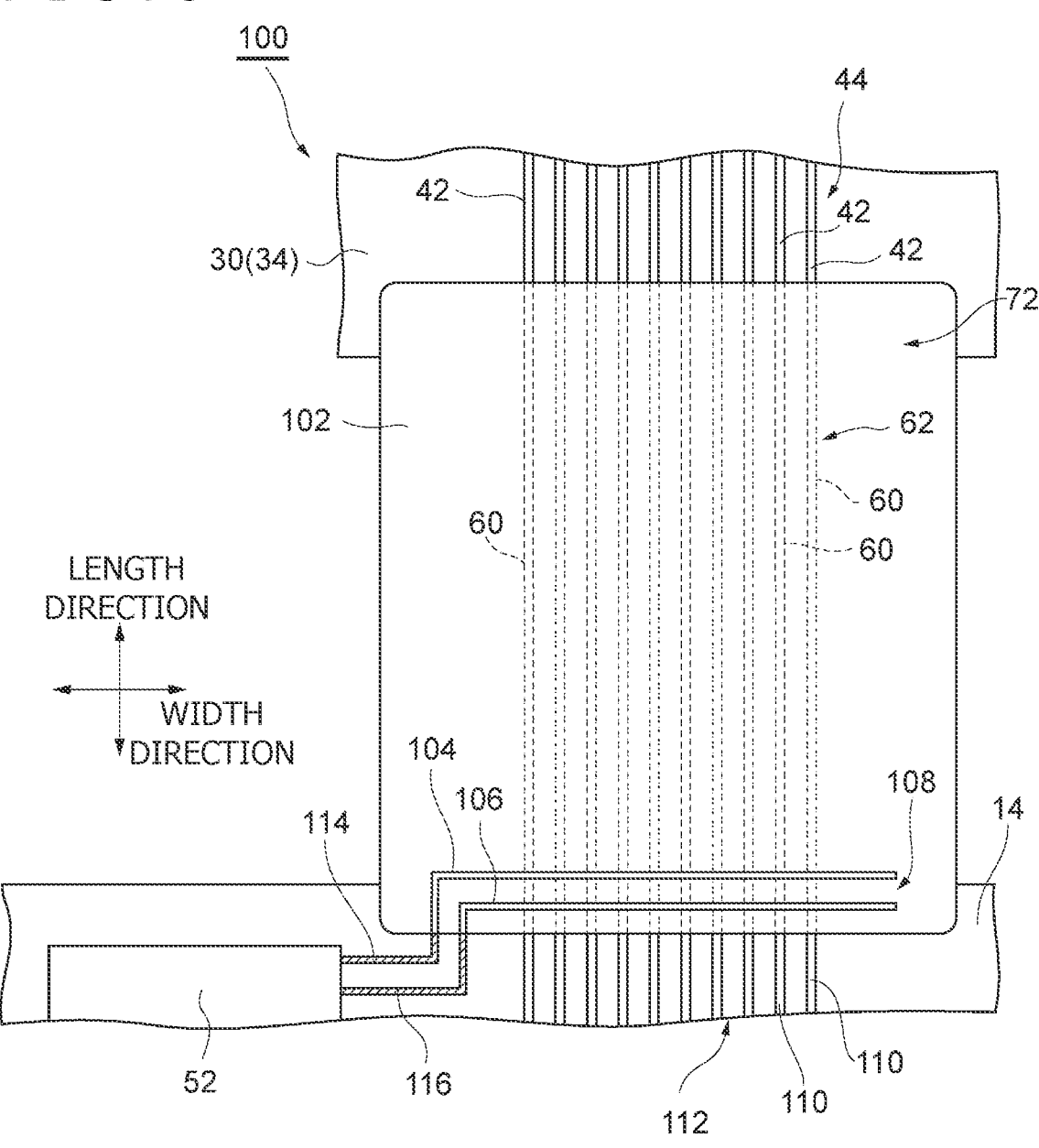
FIG. 6 is a partial plan view of a sensor board group in a second modification of the first embodiment.

FIG. 6 is a cross-sectional view of a sensor board group 100 in a second modification of the first embodiment. The sensor board group 100 includes the detection board 30 with a configuration similar to the configuration in the case of the first embodiment, a flexible board 102 (first board), and the main board 14 (second board).

The signal line group 62 (first signal line group) including the plurality of signal lines 60 and two additional signal lines 104 and 106 are formed on the flexible board 102. Also, the flexible board 102 and the main board 14 are crimped at a crimp section 108 on a side opposite the crimp section 72.

The signal lines 60 are extended in the length direction and lined up in the width direction. Part of the additional signal line 104 is extended in the width direction such that the additional signal line 104 crosses the signal line group 62 at a position on the back end side of the crimp section 108 in the length direction. Part of the additional signal line 106 is extended in the width direction such that the additional signal line 106 crosses the signal line group 62 at a position on the front end side of the crimp section 108 in the length direction.

Meanwhile, the touch control IC 52, a signal line group 112 (second signal line group) including a plurality of signal lines 110, and two signal lines 114 and 116 are provided on the main board 14. The plurality of signal lines 110 are extended in the length direction and lined up in the width direction. The signal lines 42, 60, and 110 included in the three signal line groups 44, 62, and 112 are aligned such that the signal lines 42, 60, and 110 are connected in line. The two additional signal lines 104 and 106 are aligned such that the two additional signal lines 104 and 106 are connected in line to the signal lines 114 and 116, respectively.

The signal lines 42 are connected to the respective sensor electrodes that are part of the touch sensor 32 (FIG. 1). Also, the signal lines 110 are connected to the respective detection pins included in the touch control IC 52. Moreover, the two signal lines 114 and 116 are connected to the respective test pins included in the touch control IC 52.

In this way, the touch control IC 52 may be provided on a board (for example, the main board 14) other than the flexible board 102. Also according to the configuration, the connection state of the boards can be inspected with a simpler wiring structure as in the case of the first embodiment.

Other Modifications

Although the additional signal lines 64 and 66 are extended such that the additional signal lines 64 and 66 orthogonally cross the signal line group 62 in the case described in the first embodiment (FIGS. 2 and 3), the arrangement of the additional signal lines is not limited to this. For example, additional signal lines separated from the signal line group 62 in the thickness direction and extended across a plurality of connection terminals (that is, a connection terminal group) connected to the signal line group 44 of the detection board 30 may be provided on the flexible board 50. The additional signal lines 64 and 66 may also be extended such that the additional signal lines 64 and 66 intersect at an angle smaller than 90 degrees.

Although the additional signal lines 64 and 66 are provided only on the flexible board 50 in the case described in the first embodiment (FIGS. 2 and 3), the arrangement of the additional signal lines is not limited to this. For example, additional signal lines separated from the signal line group 44 in the thickness direction of the detection board 30 and extended across the signal line group 44 (or a connection terminal group connected to the signal line group 62 of the flexible board 50) may be provided on the detection board 30. In this way, the connection state of the signal lines 42 can also be inspected, and the causes can be more easily distinguished.

Although the additional lines 64 and 66 are provided at positions across the crimp section 72 in the case described in the first embodiment (FIGS. 2 and 3), the arrangement of the additional signal lines is not limited to this. For example, at least one additional signal line may be provided at a position including a crimp section 73 on the flexible board 50. In this way, the connection state at the connection part of the signal lines 42 and 60 can be directly inspected.

Although the additional signal lines 64 and 66 are connected to the touch control IC 52 in the case described in the first embodiment (FIG. 2), the connection mode of the additional signal lines is not limited to this. For example, an input terminal may be provided on one end side of the additional signal line. The connection state can easily be inspected by, for example, connecting an external inspection apparatus to the input terminal.

Although the touch control IC 52 transmits the test signals from the additional signal lines 64 and 66 in the case described in the first embodiment (FIG. 4), the operation of the touch control IC 52 may be the opposite. Specifically, the touch control IC 52 may sequentially transmit test signals through the signal lines 60 and receive response signals through the additional signal lines 64 and 66.

Second Embodiment

Configuration of Display Board 130

Figure 7:
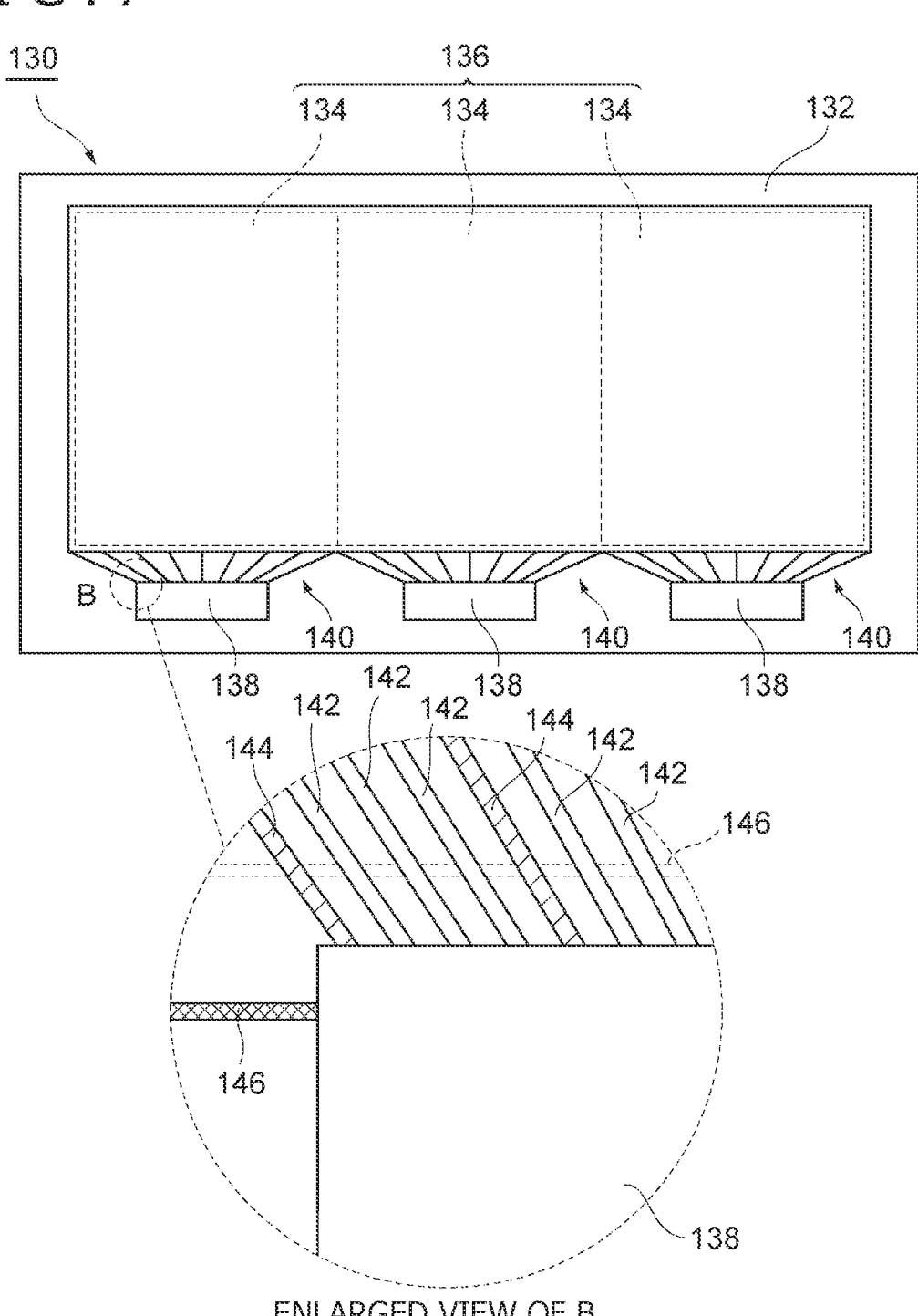
FIG. 7 is a plan view of a display board in a second embodiment of the present disclosure.

FIG. 7 is a plan view of a display board 130 in a second embodiment of the present disclosure. The display board 130 functions as a "built-in" (in more detailed classification, on-cell or in-cell) touch panel display in which a display panel and a touch sensor are integrated. The display board 130 includes a base 132, an integrated panel 136 including a plurality of divided panels 134, control integrated circuits (hereinafter, "control ICs 138"), and a plurality of signal line groups 140.

The base 132 contains an insulating heat-resistant material (for example, glass). The integrated panel 136, the control ICs 138, and the signal line groups 140 are arranged on one main surface (that is, front surface) of the base 132. The number of control ICs 138 is equal to the number of divided pieces of the integrated panel 136. That is, the divided panels 134 are connected to corresponding control ICs 138 through the signal line groups 140.

As illustrated in an enlarged view of a part B, signal lines 142 connected on the display panel side and signal lines 144 connected on the touch sensor side are periodically lined up at substantially equal intervals in the signal line group 140. One additional signal line 146 is also arranged for each control IC 138 on the base 132. The additional signal line 146 is extended in a lateral direction on the front surface of the base 132 with respect to a test pin of the control IC 138, and the additional signal line 146 is extended across the signal line group 140 on a back surface of the base 132 through a through hole not illustrated.

Description of Determination Operation

The display board 130 in the second embodiment is configured in this way. Next, a determination operation of the connection state in the display board 130 will be described. The control ICs 138 first start a control mode (that is, a test mode) for periodically or irregularly inspecting the connection state of the display board 130.

The control ICs 138 transmit test signals through test pins in the execution of the test mode. Consequently, capacitive coupling CC is formed between the additional signal lines 146 and the signal lines 144, and response signals for the test signals are generated. The control ICs 138 sequentially receive the response signals through the signal lines 144. "Reception result=OK" is determined that there is no disconnection in the signal lines 144 when the strength of the response signals exceeds a threshold. On the other hand, "reception result=N/A" is determined that there is disconnection in the signal lines 144 when the strength of response signals is equal to or lower than the threshold.

Effects

In this way, the display board 130 includes the base 132, the signal line groups 140 provided on one main surface of the base 132 and including the plurality of lined up signal lines 142 and 144, and one or more additional signal lines

146 at least partially provided on the other main surface of the base 132 and extended across the signal line groups 140.

Also according to the configuration, the connection state of the display board 130 can also be inspected with a simpler wiring structure as in the case of the first embodiment.

Third Embodiment

A board assembly in a third embodiment and an inspection method of the connection state of the board assembly will next be described with reference to FIGS. 8 and 9.
Configuration of Sensor Board Group 200

Figure 8:
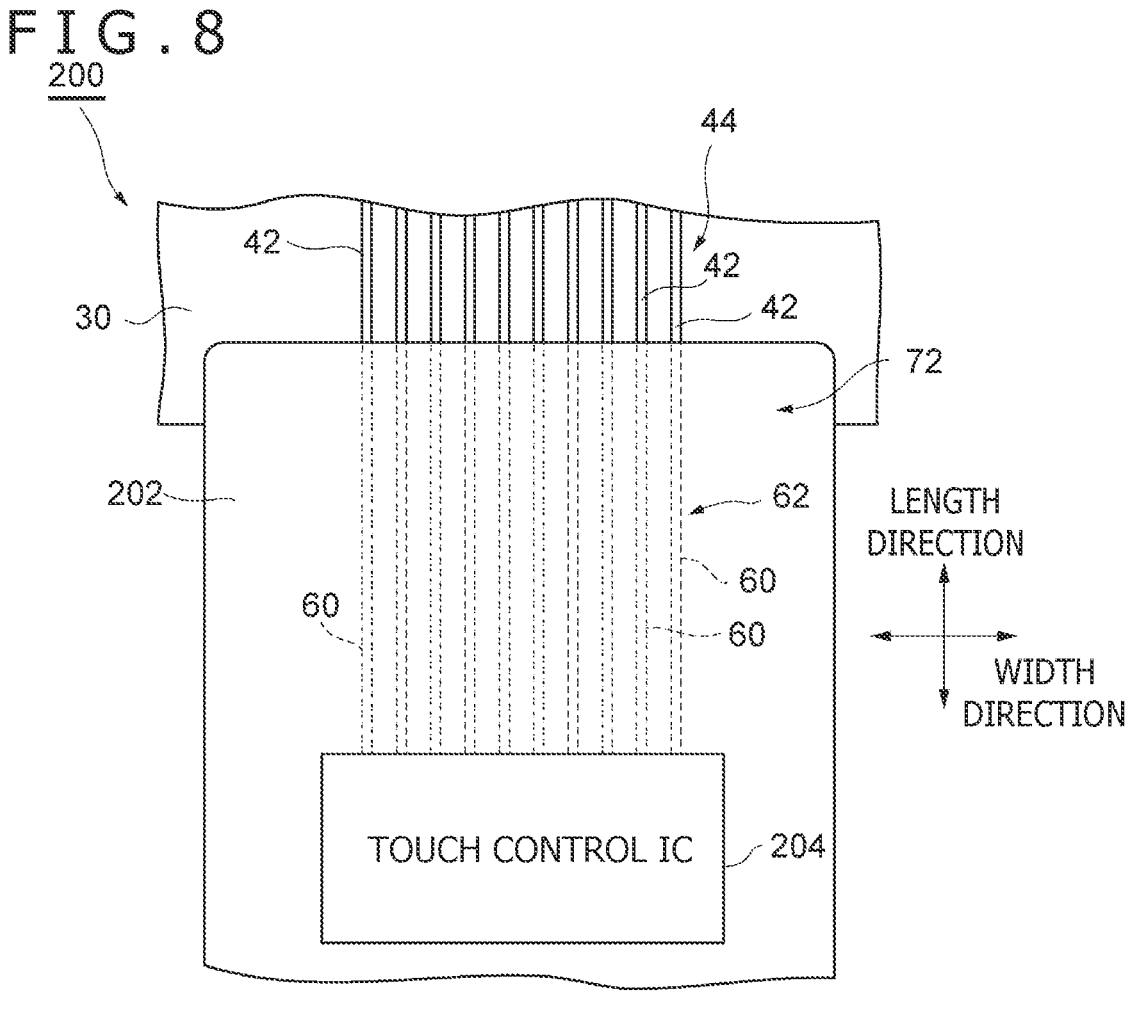
FIG. 8 is a partial plan view of a sensor board group as a board assembly in a third embodiment of the present disclosure.

FIG. 8 is a partial plan view of a sensor board group 200 in the third embodiment. The sensor board group 200 includes the detection board 30 with a configuration similar to the configuration in the case of the first embodiment, and a flexible board 202. The flexible board 202 has a configuration different from the configuration in the first embodiment (FIG. 2) in that the flexible board 202 does not include the additional signal lines 64 and 66. The flexible board 202 includes a touch control IC 204 with a function different from the function in the first embodiment.
Description of Determination Operation The sensor board group 200 in the third embodiment is configured in this way. Next, a determination operation of the connection state in the sensor board group 200 will be described. The touch control IC 204 first starts a control mode (that is, a test mode) for periodically or irregularly inspecting the connection state of the sensor board group 200.

The touch control IC 204 transmits a test signal through a first detection pin in the execution of the test mode. Consequently, capacitive coupling CC is formed between the first signal line 60 and the signal lines 60 near the first signal line 60, and response signals for the test signal are generated. The touch control IC 204 sequentially receives the response signals through the signal lines 60. As a result, response signals in higher signal levels are received near the first signal line 60.

The touch control IC 204 then transmits a test signal through a second detection pin and sequentially receives response signals through adjacent signal lines 60. The touch control IC 204 sequentially receives response signals while sequentially changing the signal lines 60 that transmit the test signals.

Figure 9:
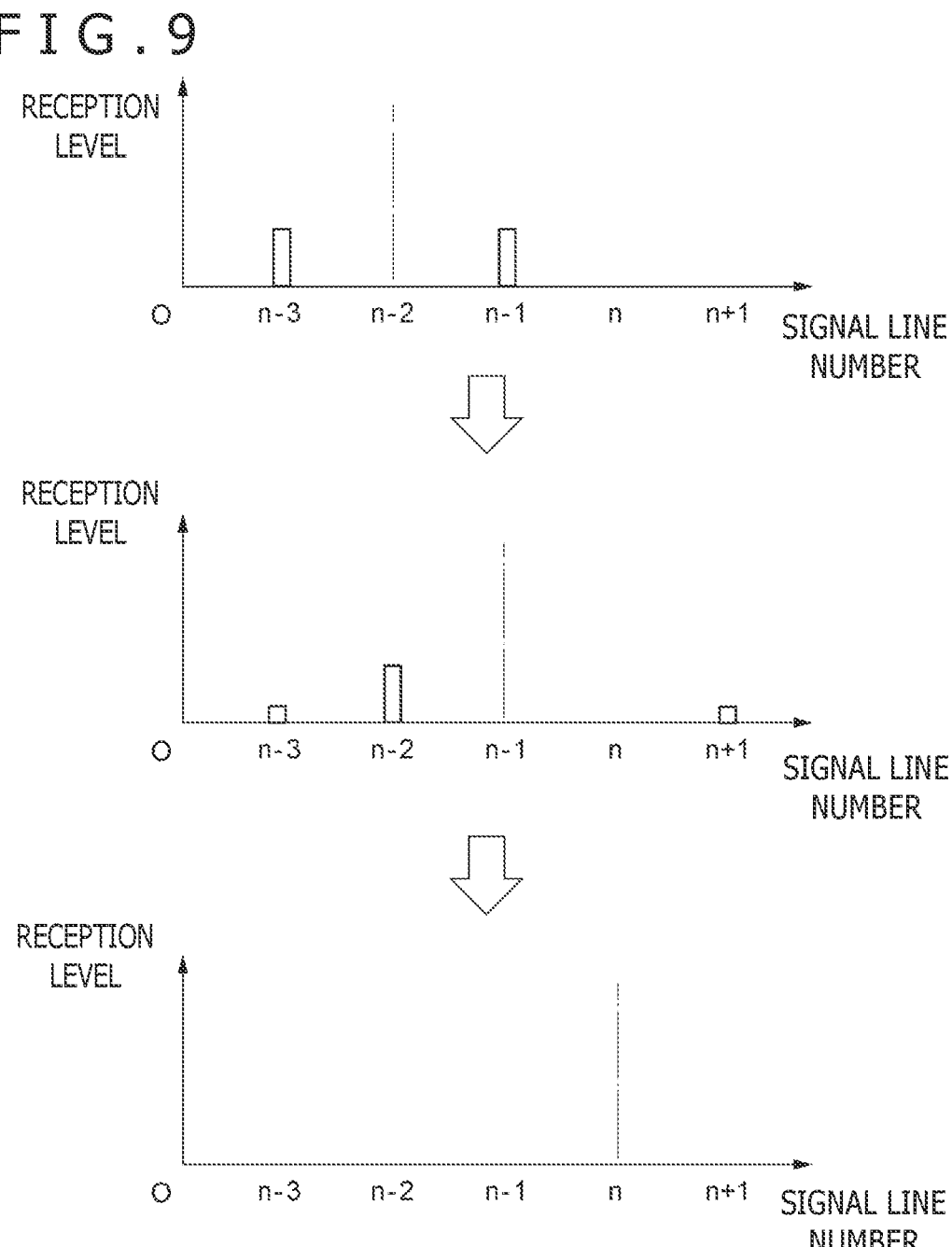
FIG. 9 depicts an example of a determination method of the connection state in the sensor board group of FIG. 8.

FIG. 9 depicts an example of the determination method of the connection state in the sensor board group 200 of FIG. 8. The connection state assumed here is that only an nth signal line 60 of N signal lines 60 is disconnected. When the test signal is transmitted from an (n−2)th signal line 60, response signals with the signal levels exceeding a threshold are received from adjacent (n−3)th and (n−1)th signal lines 60. When the test signal is transmitted from the (n−1)th signal line 60, a response signal with the signal level exceeding the threshold is received from the adjacent (n−2) th signal line 60, and a response signal with the signal level equal to or lower than the threshold is received from the adjacent nth signal line 60. When a test signal is transmitted from the nth signal line, response signals with the signal levels equal to or lower than the threshold are received from the adjacent (n−1)th and (n+1)th signal lines 60.

In this way, the touch control IC 204 can use the capacitive coupling CC formed between adjacent signal lines 60 to determine the connection state of the signal lines 60.
Effects In this way, the touch control IC 204 as a touch controller is connected to the signal line group 62 including the plurality of lined up signal lines 60. The touch control IC 204 may transmit a test signal from one signal line 60 and receive, from other signal lines 60 adjacent to the one signal line 60, response signals associated with the capacitive coupling CC formed between the signal lines 60. The touch control IC 204 may determine the connection state of the signal lines 60, based on the strength of the response signals.

According to the configuration thus described, the connection state of the sensor board group 200 can be inspected without providing the additional signal lines 64 and 66 (FIGS. 2 and 3).

It is to be noted that the embodiment of the present disclosure is not limited to the foregoing embodiment, and that various changes can be made without departing from the spirit of the present disclosure The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A board assembly comprising:
a first board including a first signal line group including a plurality of signal lines formed by a first conductive layer and extended in a first direction and lined up in a second direction orthogonal to the first direction; and
a second board including a second signal line group formed by a second conductive layer and including a plurality of signal lines extended in the first direction and lined up in the second direction orthogonal to the first direction,
wherein the first board and the second board are fixed such that the signal lines included in the first signal line group and the second signal line group are connected in line, and
wherein the second board includes a first additional signal line separated from the second signal line group in a thickness direction of the second board and extended across the second signal line group at a crimp section at which the first board and the second board are crimped together and the first conductive layer and the second conductive layer are electrically connected.

2. The board assembly according to claim 1, wherein:
the first board includes an additional signal line separated from the first signal line group in a thickness direction of the first board and extended across a first connection terminal group including a plurality of connection terminals connected to the first signal line group or the second signal line group.

3. The board assembly according to claim 1, further comprising:
an anisotropic conductive film containing a thermosetting resin between the first board and the second board, wherein the first board and the second board are fixed by being heated and pressed at the crimp section, and wherein the crimp section includes the anisotropic conductive film.

4. The board assembly according to claim 3, wherein:

the second board includes a second additional signal line separated from the second signal line group in the thickness direction of the second board and extended across at the crimp section at which the first board and the second board are crimped together and the first conductive layer and the second conductive layer are electrically connected, and the first additional signal line is spaced apart from the second additional signal line.

5. The board assembly according to claim 3, wherein:

the second board includes at least one additional signal line at a position including the crimp section.

6. The board assembly according to claim 3, wherein:

the second board includes at least two additional signal lines across the crimp section along the second direction.

7. The board assembly according to claim 1, wherein:

the second signal line group is provided on a first main surface of the second board, and the first additional signal line is provided on a second main surface of the second board.

8. The board assembly according to claim 1, wherein:

the second signal line group and the first additional signal line are provided on a first main surface of the second board.

9. The board assembly according to claim 1, wherein:

the first board is a detection board including a touch sensor, the second board is a flexible board with flexibility, and the touch sensor is connected to an integrated circuit that, in operation, controls the touch sensor through the first signal line group and the second signal line group.

10. The board assembly according to claim 9, wherein the integrated circuit is provided on the flexible board.

11. An electronic device comprising:

a board assembly including:

a first board including a first signal line group formed by a first conductive layer and including a plurality of signal lines extended in a first direction and lined up in a second direction orthogonal to the first direction, and a second board including a second signal line group formed by a second conductive layer and including a plurality of signal lines extended in the first direction and lined up in the second direction orthogonal to the first direction, wherein the first board and the second board are fixed such that the signal lines included in the first signal line group and the second signal line group are connected in line, and wherein the second board includes an additional signal line separated from the second signal line group in a thickness direction of the second board and extended across a crimp section at which the first board and the second board are crimped together and the first conductive layer and the second conductive layer are electrically connected.

* * * * *